(12) United States Patent
Yang

(10) Patent No.: US 10,314,205 B2
(45) Date of Patent: Jun. 4, 2019

(54) FLAME RETARDANT STRUCTURE FOR ELECTRONIC COMPONENT

(71) Applicant: NANNING FUGUI PRECISION INDUSTRIAL CO., LTD., Nanning (CN)

(72) Inventor: Ta-Wei Yang, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 16 days.

(21) Appl. No.: 15/710,951

(22) Filed: Sep. 21, 2017

(65) Prior Publication Data

US 2019/0090387 A1    Mar. 21, 2019

(51) Int. Cl.
  *H05K 7/20*    (2006.01)

(52) U.S. Cl.
  CPC ......... *H05K 7/20463* (2013.01); *H05K 7/205* (2013.01)

(58) Field of Classification Search
  CPC .... H05K 1/0209; H05K 3/284; H05K 7/1495; G11B 23/021; A62C 2/00; A62C 3/00; A62C 3/16; A62C 4/00; A62C 35/00
  See application file for complete search history.

(56) References Cited

U.S. PATENT DOCUMENTS

| | | | | |
|---|---|---|---|---|
| 7,545,639 B2 * | 6/2009 | Ridge | ................... | G11B 23/021 109/75 |
| 8,605,414 B2 * | 12/2013 | Moore | ..................... | G06F 1/182 361/679.02 |
| 8,817,471 B2 * | 8/2014 | Barna | ..................... | A62C 37/36 109/31 |
| 2005/0286225 A1 * | 12/2005 | Moore | ..................... | G06F 1/182 361/695 |
| 2007/0017685 A1 * | 1/2007 | Moore | ................. | G11B 33/142 174/17 VA |
| 2008/0190627 A1 * | 8/2008 | Koelewijn | ............. | A62C 5/006 169/46 |
| 2009/0050365 A1 * | 2/2009 | Moore | ................. | G11B 33/142 174/547 |
| 2009/0219679 A1 * | 9/2009 | Moore | ................... | G06F 1/182 361/679.31 |

(Continued)

FOREIGN PATENT DOCUMENTS

TW    M526173 U    7/2016

*Primary Examiner* — David M Sinclair
*Assistant Examiner* — Robert D Brown
(74) *Attorney, Agent, or Firm* — ScienBiziP, P.C.

(57) ABSTRACT

A flame retardant structure for electronic component includes a printed circuit board, an electronic component, a metal heat dissipation module, a first plastic part and a receiving space formed by the printed circuit board and the metal heat dissipation module. The metal heat dissipation module has an opening, or the metal heat dissipation module and the printed circuit board form an opening. The electronic component is located in the receiving space. When the electronic component is heated, the first plastic part melts and enters into the receiving space through the opening, and the first plastic part melts to cover and protect the electronic component. The first plastic part is offered with different structures to match with different metal heat dissipation module for flexible use, low cost and high fire retardant effect.

14 Claims, 15 Drawing Sheets

(56) References Cited

U.S. PATENT DOCUMENTS

| | | | | |
|---|---|---|---|---|
| 2013/0056231 A1* | 3/2013 | Chatot | ............... | D06F 37/42 |
| | | | | 169/70 |
| 2014/0368992 A1* | 12/2014 | Strader | ............... | H01L 23/3675 |
| | | | | 361/679.54 |
| 2015/0009620 A1* | 1/2015 | Kadotani | ........... | H05K 7/20809 |
| | | | | 361/679.47 |
| 2016/0107010 A1* | 4/2016 | Cordani | ............... | A62C 3/16 |
| | | | | 169/54 |
| 2016/0381817 A1* | 12/2016 | Ott | ............... | H05K 3/284 |
| | | | | 156/272.8 |
| 2017/0090532 A1* | 3/2017 | Koukami | ............... | G06F 1/20 |

* cited by examiner

FLAME RETARDANT STRUCTURE FOR ELECTRONIC COMPONENT

FIELD

The subject matter herein generally relates to electronic component protection, and more particularly to a flame retardant structure for electronic components.

BACKGROUND

Conventional flame retardant structures for electronic components are typically made of two types. One type of flame retardant structures is made of metal, the flame retardant structure is a whole metal shell which is expensive and heavy. Another type of flame retardant structures is made of plastic which is easily melted when heated. The flame retardant structure made of plastic is not having a part to guide the plastic flowing in a proper position, and an electronic component maybe not protected by the flame retardant structures. Therefore, the flame retardant structures can not protect the electronic component exposed outside.

BRIEF DESCRIPTION OF THE DRAWINGS

Implementations of the present technology will now be described with reference to the attached figures.

DETAILED DESCRIPTION

Figure 1:
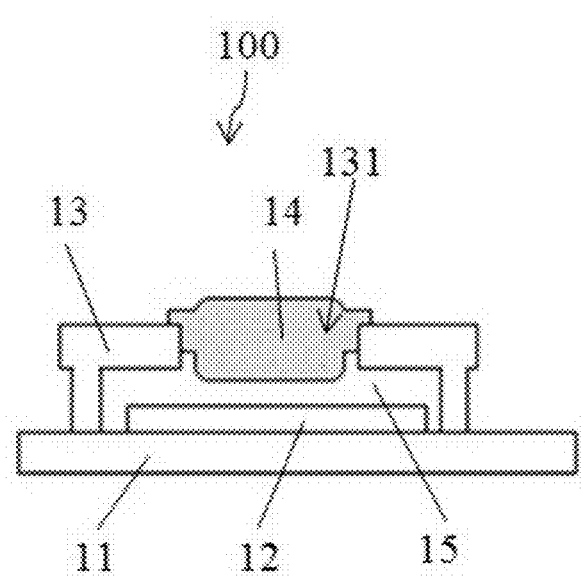
FIG. 1 is an isometric view of an exemplary embodiment of a flame retardant structure for electronic component.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts have been exaggerated to better illustrate details and features of the present disclosure.

The disclosure is illustrated by way of example and not by way of limitation in the figures of the accompanying drawings in which like reference numerals indicate the same or similar elements. It should be noted that references to "an" or "one" exemplary embodiment in this disclosure are not necessarily to the same exemplary embodiment, and such references can mean "at least one".

Referring to FIG. 1, an exemplary embodiment of a flame retardant structure 100 for electronic component includes a printed circuit board 11, an electronic component 12, a metal heat dissipation module 13 and a first plastic part 14. The metal heat dissipation module 13 maybe a heat dissipation or other metal shells. The printed circuit board 11 and the metal heat dissipation module 13 form a receiving space 15. The electronic component 12 is mounted on the printed circuit board 11 and in the receiving space 15. The metal heat dissipation module 13 has an opening 131 above the printed circuit board 11. The first plastic part 14 lies in the opening 131 and seals the opening 131. The opening 131 can be any shape, and the first plastic part 14 can be any shape larger than the opening 131 so as to not fall through the opening 131. In this exemplary embodiment, the opening 131 is formed with an annular groove and a through hole. The first plastic part 14 has an outer peripheral part matching in shape with the annular groove and a middle part to pass through the through hole. The outer peripheral part is thinner than the middle part.

Figure 2:
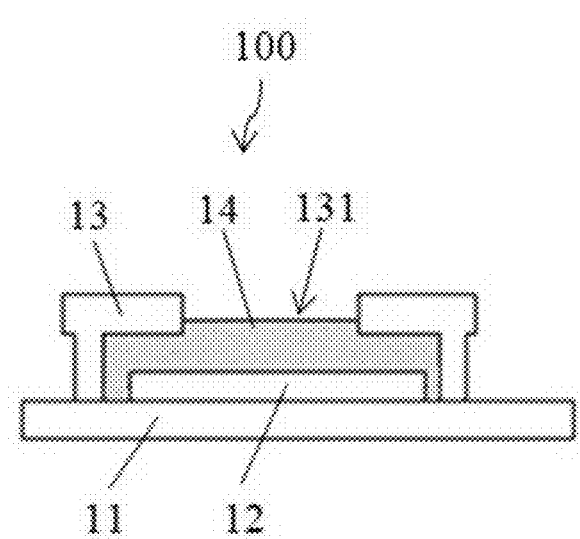
FIG. 2 is an isometric view of the flame retardant structure for electronic component heated in FIG. 1.

Referring to FIG. 2, when the flame retardant structure 100 for electronic component is heated, the first plastic part 14 melts and enters into the receiving space 15 to fill up the receiving space 15. The electronic component 12 becomes covered and protected by the melted first plastic part 14. The melted volume of the first plastic part 14 is typically greater than a volume of the receiving space 15. Preferably, but not requiredly, the electronic component 12 becomes completely covered by the first plastic part 14 for protection.

Figure 3:
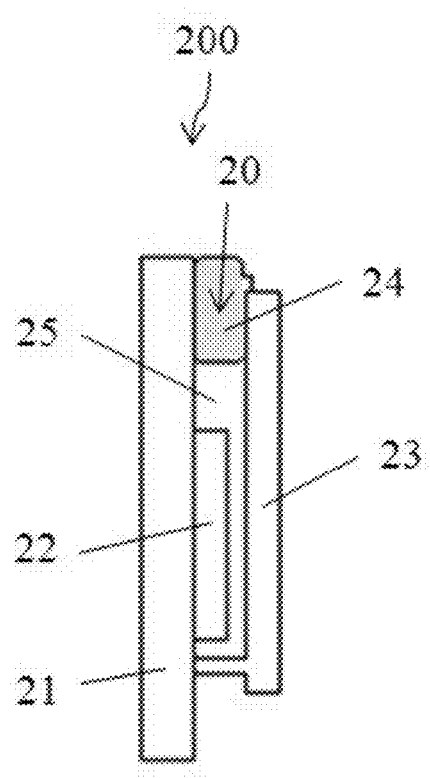
FIG. 3 is an isometric view of a second exemplary embodiment of a flame retardant structure for electronic component.

Referring to FIG. 3, a second exemplary embodiment of a flame retardant structure 200 for electronic component includes a printed circuit board 21, an electronic component 22, a metal heat dissipation module 23, a first plastic part 24 and a receiving space 25 formed by the printed circuit board 21 and the metal heat dissipation module 23. The electronic component 22 is in the receiving space 25. The metal heat dissipation module 23 and the printed circuit board 21 form an opening 20 above the printed circuit board 21. The first plastic part 24 lies in the opening 20 and seals the opening 20.

Figure 4:
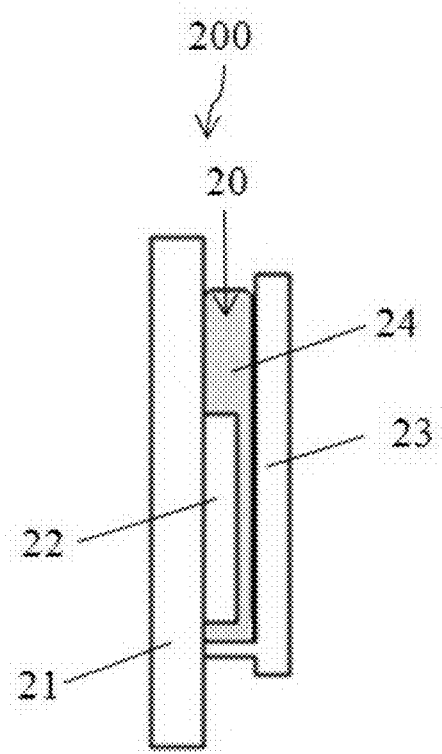
FIG. 4 is an isometric view of the flame retardant structure for electronic component heated in FIG. 3.

Referring to FIG. 4, when the flame retardant structure 200 for electronic component is heated, the first plastic part 24 melts and enters into the receiving space 25 to fill up the receiving space 25. The electronic component 22 becomes covered and protected by the first plastic part 24 for protection.

Figure 5:
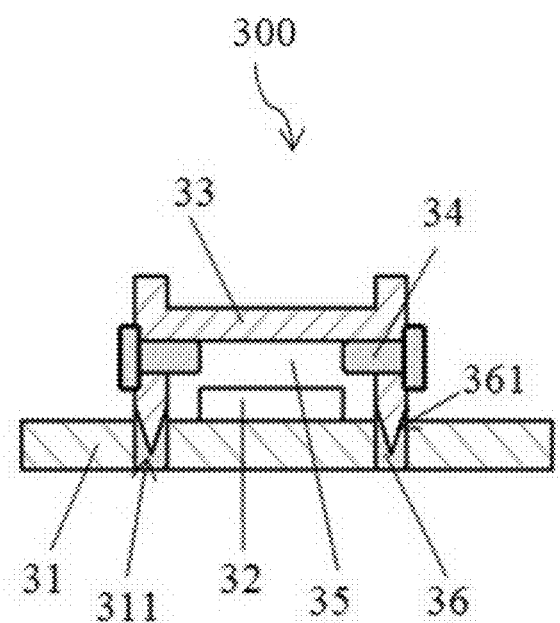
FIG. 5 is an isometric view of a third exemplary embodiment of a flame retardant structure for electronic component.

Referring to FIG. 5, a third exemplary embodiment of a flame retardant structure 300 for electronic component includes a printed circuit board 31, an electronic component 32, a metal heat dissipation module 33, a first plastic part 34, a receiving space 35 formed by the printed circuit board 31 and the metal heat dissipation module 33, and a second plastic part 36. The metal heat dissipation module 33 has two openings 331 in the same height position. The two openings 331 are above the printed circuit board 31. Two first plastic parts 34 are respectively enters into the two openings 331 and partly extended out from the two openings 331. The printed circuit board 31 has two second through holes 311. The second plastic part 36 is filled up the two second through holes 311. The second plastic part 36 defines a recess 361, and the metal heat dissipation module 33 is mounted on the printed circuit board 31 through the recess 361.

Figure 6:
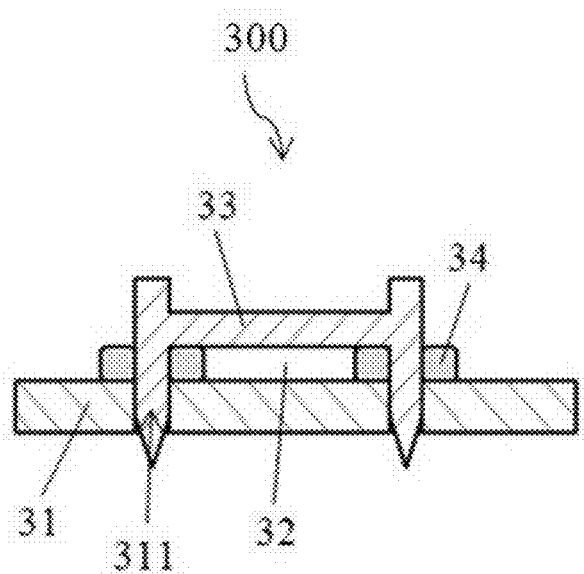
FIG. 6 is an isometric view of the flame retardant structure for electronic component heated in FIG. 5.

Referring to FIG. 6, when the flame retardant structure 300 for electronic component is heated, the first plastic part 34 melts and enters into the receiving space 35 to fill up the receiving space 35. When the second plastic part 36 is heated to melt, the metal heat dissipation module 33 enters into the second through hole 311 of the printed circuit board 31 by the gravity of the metal heat dissipation module 33. The electronic component 32 becomes covered and protected by the first plastic part 34 and the metal heat dissipation module 33 for protection.

Of course, the flame retardant structure for electronic component can present a variety of different structures. The different structures mainly refer to different structure of the metal heat dissipation module and the first plastic part. Referring to FIGS. 7a-7i show other exemplary embodiments of a metal heat dissipation module and a first plastic part with various structures for a flame retardant structure for electronic component.

Figure 7A:
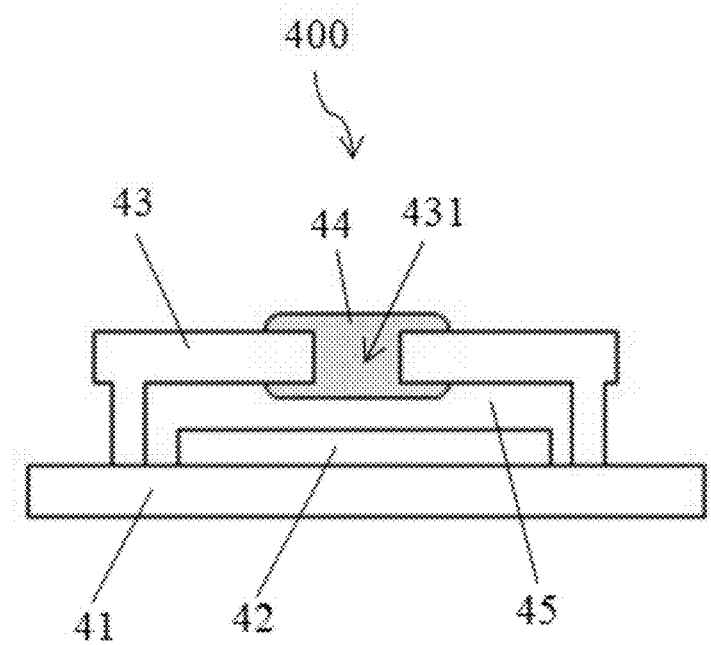
FIG. 7a-7i are isometric views of other exemplary embodiments of a metal heat dissipation module and a first plastic part with various structures for a flame retardant structure for electronic component.

Referring to FIG. 7a, a flame retardant structure for 400 electronic component includes a printed circuit board 41, an electronic component 42, a metal heat dissipation module 43, a first plastic part 44 and a receiving space 45 formed by the printed circuit board 41 and the metal heat dissipation module 43. The metal heat dissipation module 43 has an opening 431 above the printed circuit board 41. The first plastic part 44 is a regular shape and seals the opening 431. When the first plastic part 44 is heated, the first plastic part 44 melts to cover and protect the electronic component 42.

Figure 7B:
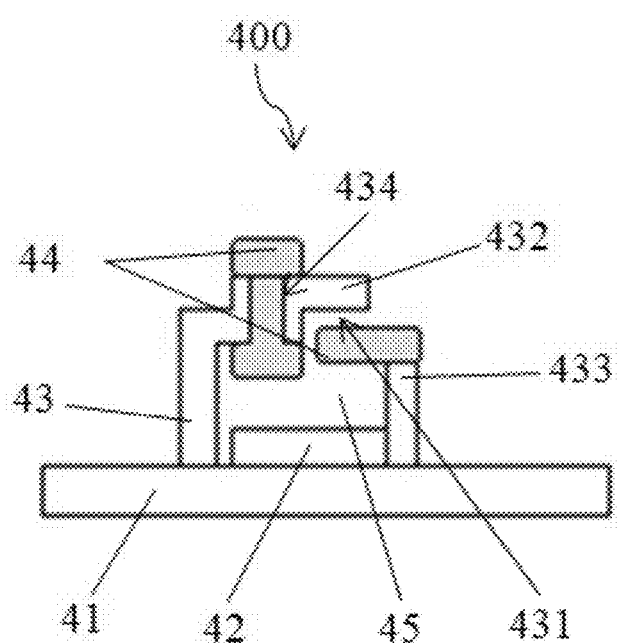

Referring to FIG. 7b, a flame retardant structure 400 for electronic component includes a printed circuit board 41, an electronic component 42, a metal heat dissipation module 43, a first plastic part 44 and a receiving space 45 formed by the printed circuit board 41 and the metal heat dissipation module 43. The metal heat dissipation module 43 has a first end 432 and a second end 433. An opening 40 is formed between the first end 432 and the second end 433. The opening 40 is above the printed circuit board 41. The metal heat dissipation module 43 is an irregular shape and forms a step at the top of the metal heat dissipation module 43. The first end 432 is higher than the second end 433. A first through hole 434 is closed to the first end 432. The flame retardant structure 400 has two first plastic parts 44. One of the I-shaped first plastic part 44 passes through the first through hole 434 and mounted on the metal heat dissipation module 43. The other of the first plastic part 44 is mounted on the second end 433, and is not sealed the opening 40. Two of the first plastic parts 44 are above the printed circuit board 41. When the first plastic part 14 is heated, the first plastic part 14 melts to cover and protect the electronic component 42.

Figure 7C:
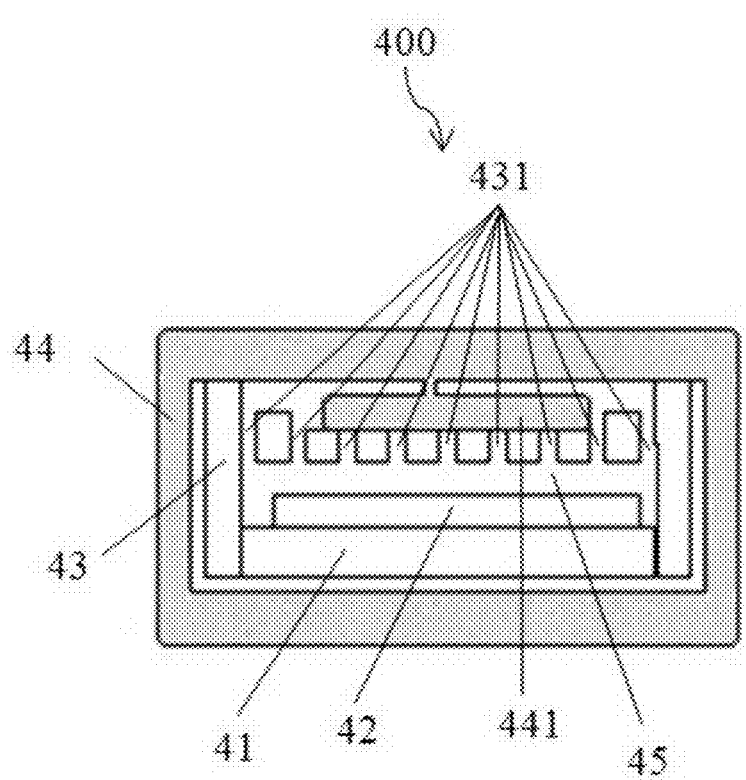

Referring to FIG. 7c, a flame retardant structure 400 for electronic component includes a printed circuit board 41, an electronic component 42, a metal heat dissipation module 43, a first plastic part 44 and a receiving space 45 formed by the printed circuit board 41 and the metal heat dissipation module 43. The metal heat dissipation module 43 has a plurality of openings 431 above on the printed circuit board 41. The first plastic part 44 forms a closed space, the metal heat dissipation module 43, the printed circuit board 41 and the electronic component 42 locates in the closed space. The first plastic part 44 has an extending portion 441 covering a portion of the plurality of openings 431. When the first plastic part 44 is heated, the first plastic part 44 melts to cover and protect the electronic component 42.

Figure 7D:
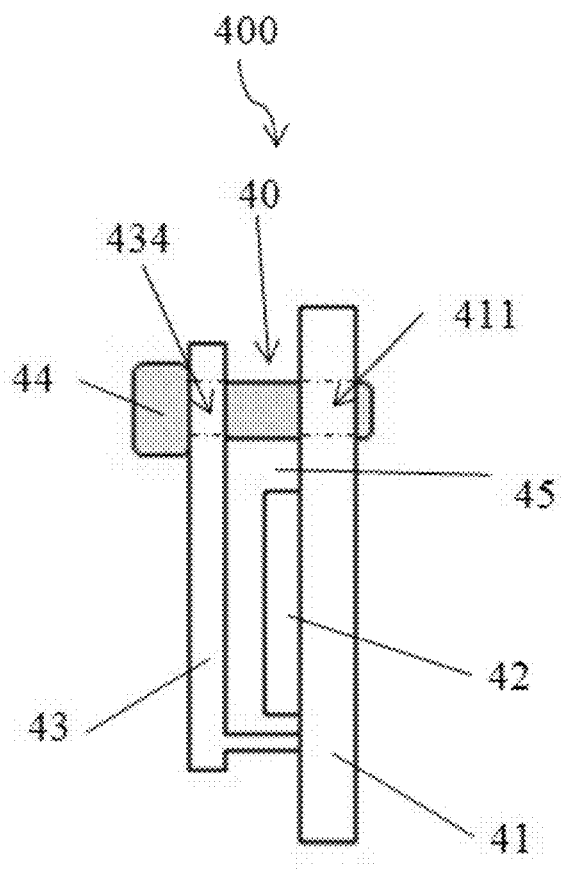

Referring to FIG. 7d, a flame retardant structure 400 for electronic component includes a printed circuit board 41, an electronic component 42, a metal heat dissipation module 43, a first plastic part 44 and a receiving space 45 formed by the printed circuit board 41 and the metal heat dissipation module 43. The metal heat dissipation module 43 and the printed circuit board 41 form an opening 40 above the printed circuit board 41. The metal heat dissipation module 43 has a first through hole 434. The printed circuit board 41 has a second through hole 411. The first plastic part 44 passes through the first through hole 434, the second through hole 411 and seals the opening 40. When the first plastic part 44 is heated, the first plastic part 44 melts to cover and protect the electronic component 42.

Figure 7E:
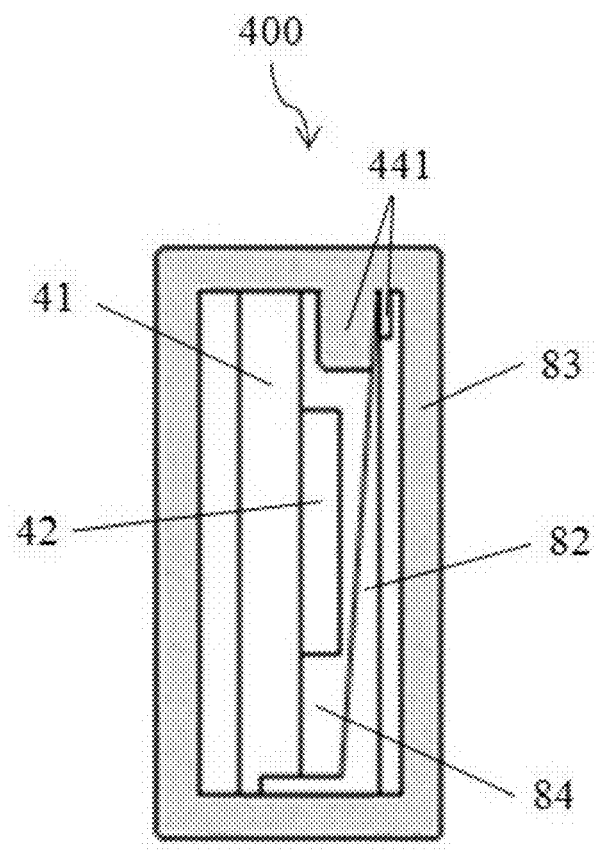

Referring to FIG. 7e, a flame retardant structure 400 for electronic component includes a printed circuit board 41, an electronic component 42, a metal heat dissipation module 43, a first plastic part 44 and a receiving space 45 formed by the printed circuit board 41 and the metal heat dissipation module 43. The first plastic part 44 forms a closed space, the metal heat dissipation module 43, the printed circuit board 41 and the electronic component 42 locates in the closed space. The metal heat dissipation module 43 and the printed circuit board 41 form an opening 40 above the printed circuit board 41. The first plastic part 44 has an extending portion 441 entering into the opening 40 and clamped by the metal heat dissipation module 43. When the first plastic part 44 is heated, the first plastic part 44 melts to cover and protect the electronic component 42.

Figure 7F:
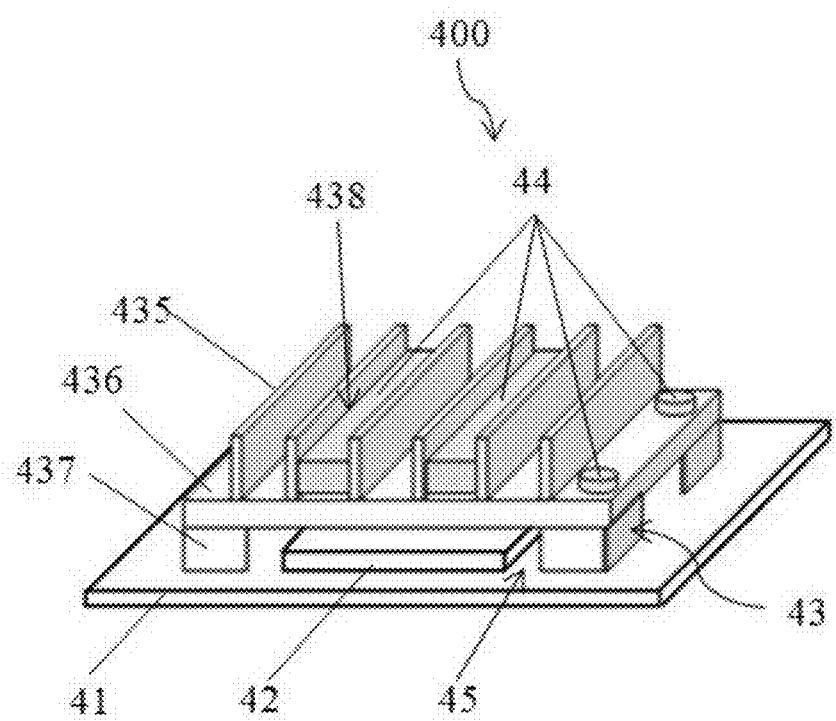
Figure 7G:
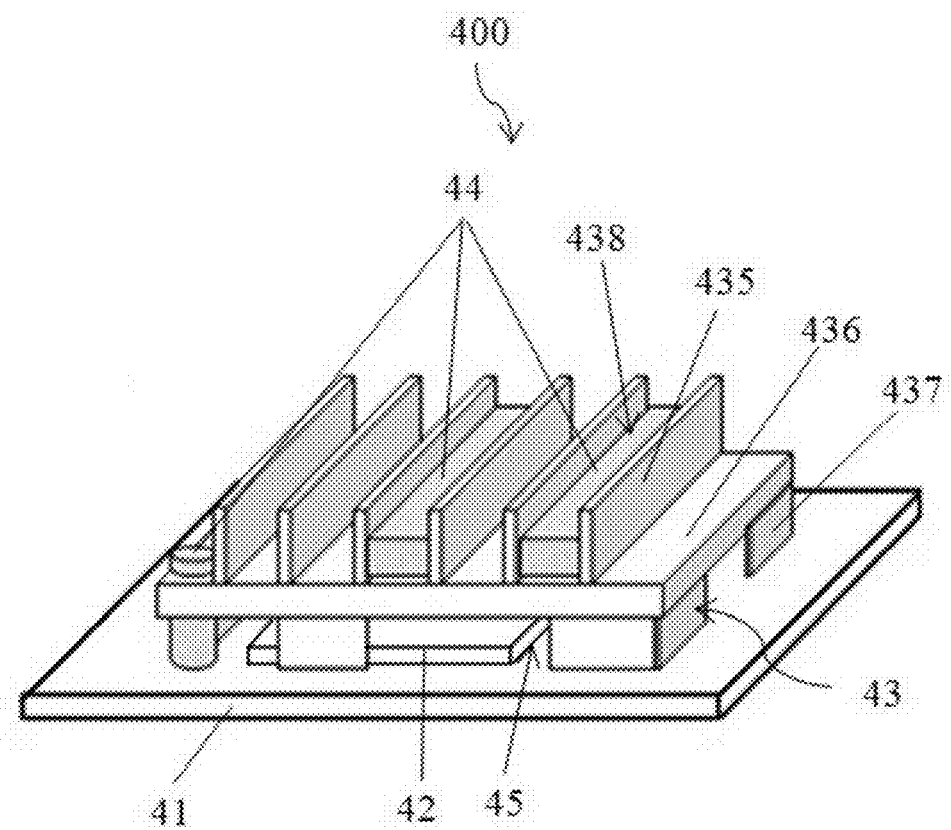

Referring to FIGS. 7f-7g, a flame retardant structure 400 for electronic component includes a printed circuit board 41, an electronic component 42, a metal heat dissipation module 43, a first plastic part 44 and a receiving space 45 formed by the printed circuit board 41 and the metal heat dissipation module 43. The metal heat dissipation module 43 is a heat dissipation comprising a plurality of radiating fins 435, a bottom plate 436 and a foot 437. An interval region 438 is formed between the plurality of radiating fins 435, and the interval region 438 has an opening (not shown) above the printed circuit board 41. Also, a first through hole maybe occurred on the periphery of the bottom plate 436 close to the foot 437. The first plastic part 44 lies above the opening and located in the first through hole. When the first plastic part 44 is heated, the first plastic part 44 melts to cover and protect the electronic component 42.

Figure 7H:
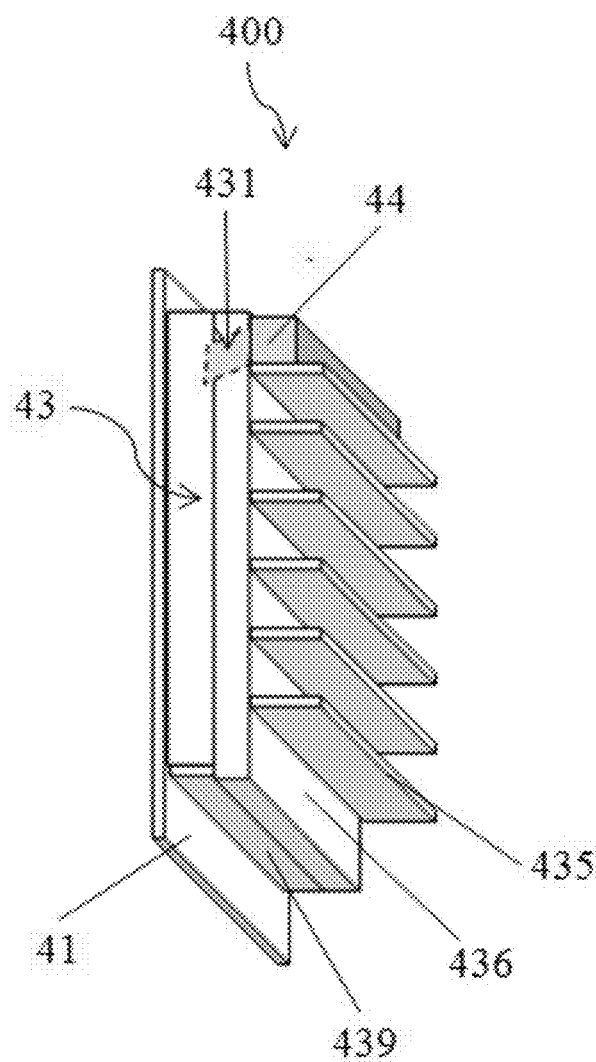

Referring to FIG. 7h, the metal heat dissipation module 43 is a heat dissipation comprising a plurality of radiating fins 435 and a bottom plate 436. The bottom plate 436 below around has a skirt 439, and the bottom plate 436, the skirt 439 and the printed circuit board 41 form a receiving space (not shown). The metal heat dissipation module 43 has an opening 431 above the printed circuit board 41. When the first plastic part 44 is heated, the first plastic part 44 melts to cover and protect the electronic component 42.

Figure 7I:
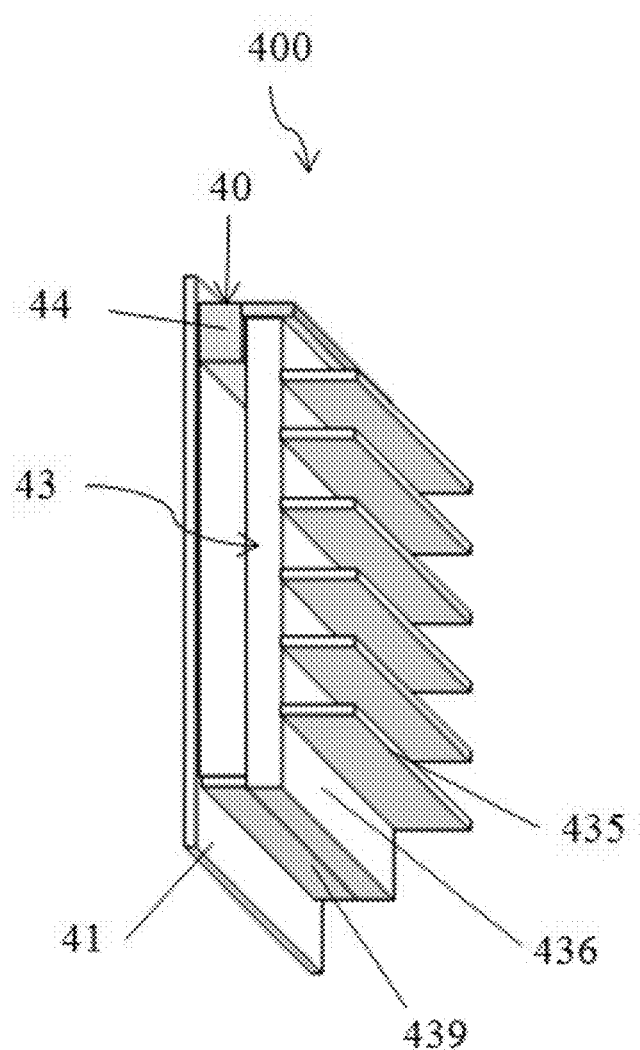

Referring to FIG. 7i, the metal heat dissipation module 43 has a bottom plate 436 and a skirt 439. The bottom plate 436, the skirt 439 and the printed circuit board 41 form an opening 40 higher than the skirt 439. The first plastic part 44 is L shape with two sides. One side of the first plastic part 44 enters into the opening to make the first plastic part 44 mounted between the printed circuit board 41 and the metal heat dissipation module 43. When the first plastic part 44 is heated, the first plastic part 44 melts to cover and protect the electronic component 42.

In the exemplary embodiment, the flame retardant structure for electronic component presents various structures because of different structure of the plastic part matched with different metal heat dissipation module. The plastic part can be various shapes like a screw, a spacer, a fixture or other filling form existed. When the plastic part is in a normal temperature, the plastic works with locking or clamping function. When the plastic part is heated, the plastic part melts to fill up an external space around the electronic component. Therefore to cut off the air flow into the electronic component, and protect the electronic component. The plastic part is offered with different structures to match with different metal heat dissipation module for flexible use, low cost and high fire retardant effect.

The exemplary embodiments shown and described above are only examples. Many details are often found in the art such as the other features of case with device for tool free unlocking access. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A flame retardant structure for electronic component comprising:
   a printed circuit board;
   an electronic component mounted on the printed circuit board;
   a metal heat dissipation module having an opening, wherein a receiving space is defined by the metal heat dissipation module and the printed circuit board, and the electronic component is located in the receiving space; and
   a first plastic part, wherein when the electronic component is heated, the first plastic part melts and enters into the receiving space through the opening, and the first plastic part melted covers the electronic component.

2. The flame retardant structure for electronic component of claim 1, wherein the opening is above the printed circuit board, the first plastic part lies in and seals the opening.

3. The flame retardant structure for electronic component of claim 1, wherein the first plastic part completely surrounds the metal heat dissipation module, the printed circuit board and the electronic component.

4. The flame retardant structure for electronic component of claim 1, wherein the metal heat dissipation module has a first through hole, and there are two first plastic parts, one of the first plastic parts passes through the first through hole, the other one of the first plastic parts lies in the opening, and the first plastic parts are located above the electronic component.

5. The flame retardant structure for electronic component of claim 4, wherein the printed circuit board has a second through hole filled with a second plastic part, the second plastic part defines a recess, and the metal heat dissipation module is mounted on the printed circuit board through the recess.

6. The flame retardant structure for electronic component of claim 5, wherein when the second plastic part is heated to melt, the metal heat dissipation module enters into the second through hole of the printed circuit board by the gravity of the metal heat dissipation module.

7. The flame retardant structure for electronic component of claim 5, wherein the metal heat dissipation module is a heat dissipation comprising a plurality of radiating fins, a bottom plate and a foot, an interval region is formed between the plurality of radiating fins, and the interval region has an opening, the first plastic part lies above the opening and located in the first through hole.

8. The flame retardant structure for electronic component of claim 1, wherein the metal heat dissipation module has a first through hole, the first plastic part passes through the first through hole and is in communication with the opening.

9. The flame retardant structure for electronic component of claim 1, wherein the metal heat dissipation module is a heat dissipation comprising a plurality of radiating fins and a bottom plate, the bottom plate below has a skirt, the bottom plate has an opening, the first plastic part is in the opening.

10. A flame retardant structure for electronic component comprising:
    a printed circuit board;
    an electronic component mounted on the printed circuit board;
    a metal heat dissipation module, wherein a receiving space is defined by the metal heat dissipation module and the printed circuit board, and the electronic component is located in the receiving space, wherein an opening, placed in communication with the receiving space, is defined by the metal heat dissipation module and the printed circuit board; and
    a first plastic part,
    wherein when the electronic component is heated, the first plastic part melted and enters into the receiving space through the opening, and the first plastic part melted covers the electronic component.

11. The flame retardant structure for electronic component of claim 10, wherein the opening is above the printed circuit board, the first plastic part lies in and seals the opening.

12. The flame retardant structure for electronic component of claim 10, wherein the first plastic part forms completely surrounds the metal heat dissipation module, the printed circuit board and the electronic component.

13. The flame retardant structure for electronic component of claim 10, wherein the metal heat dissipation module has a first through hole, the printed circuit board has a second through hole, the first plastic part passes through the first through hole, the second through hole and seals the opening.

14. The flame retardant structure for electronic component of claim 10, wherein the metal heat dissipation module is a heat dissipation comprising a plurality of radiating fins and a bottom plate, the bottom plate below has a skirt and an opening rounded by the skirt, the first plastic part lies in and seals the opening.

* * * * *